United States Patent [19]
McCormick

[11] 4,093,923
[45] June 6, 1978

[54] SIGNAL CANCELLING CIRCUIT

[75] Inventor: Karl McCormick, Houston, Tex.

[73] Assignee: Shell Oil Company, Houston, Tex.

[21] Appl. No.: 753,658

[22] Filed: Dec. 22, 1976

[51] Int. Cl.² .................. G11C 27/02; H04B 15/04
[52] U.S. Cl. ................................. 328/165; 328/151; 307/251; 307/304; 307/353
[58] Field of Search .............. 328/151, 165, 166, 167; 307/304, 251, 353

[56] References Cited
U.S. PATENT DOCUMENTS

| | | | |
|---|---|---|---|
| 3,504,194 | 3/1970 | Eastman et al. | 328/151 X |
| 3,564,287 | 2/1971 | Todd | 328/151 X |
| 3,659,086 | 4/1972 | Metcalf | 328/151 X |
| 3,795,877 | 3/1974 | Poole | 328/165 X |
| 4,004,238 | 1/1977 | Wichmann | 328/165 |

*Primary Examiner*—John S. Heyman

[57] ABSTRACT

A system for cancelling an unwanted or noise signal having a constant frequency, amplitude and phase while preserving a desired signal having the same frequency but a different phase. The system samples the noise signal N times each cycle and stores the sampled values of the signal. The sampling is terminated and the stored signals feedback at the sample rate with reversed polarity to cancel the noise signal.

12 Claims, 2 Drawing Figures

U.S. Patent
June 6, 1978
4,093,923
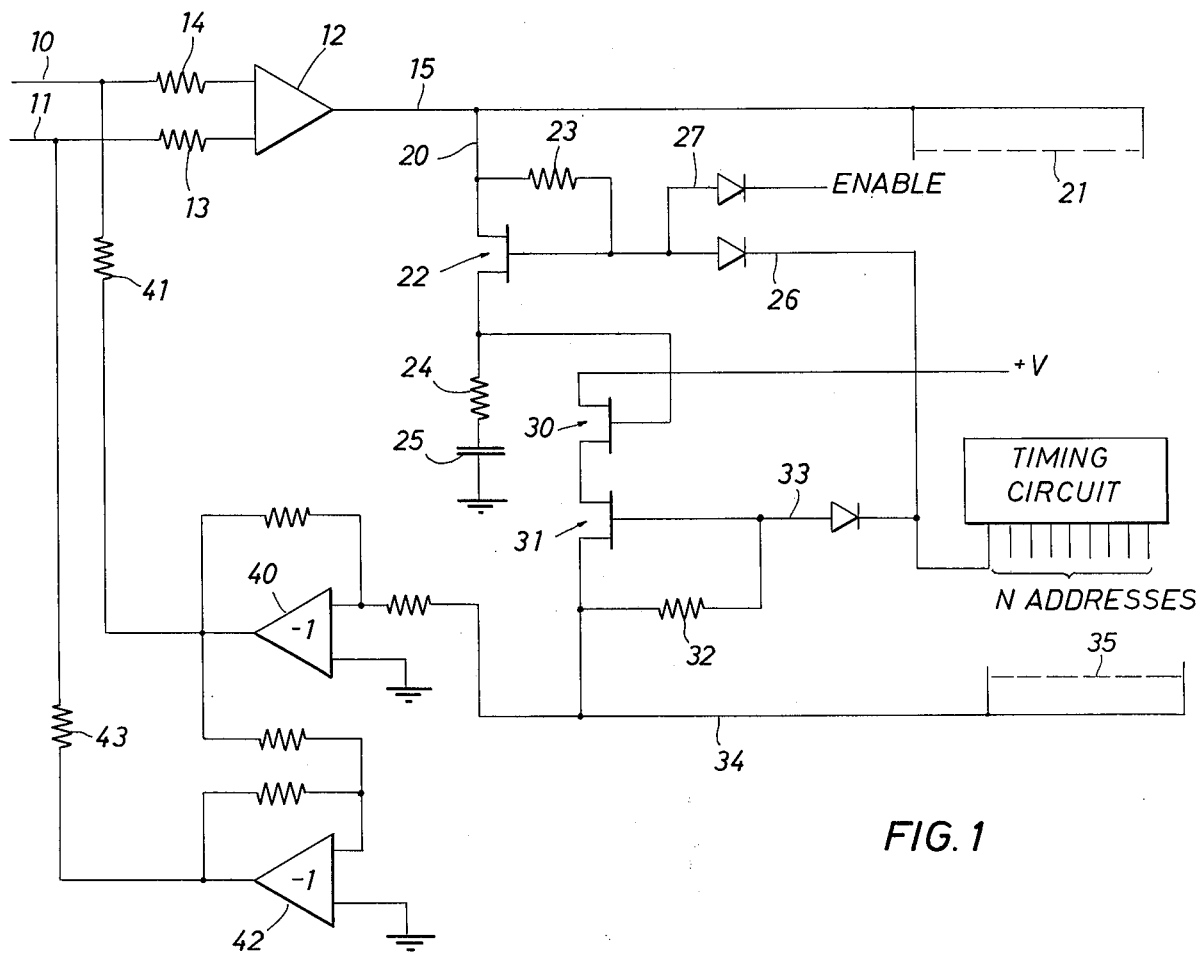
FIG. 1
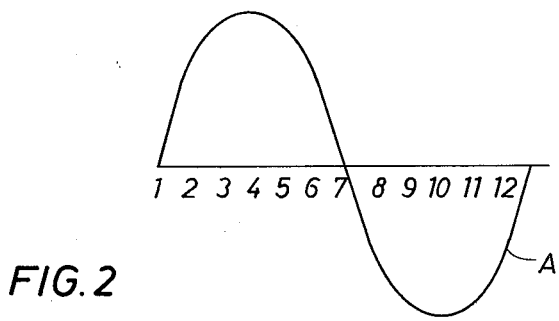
FIG. 2
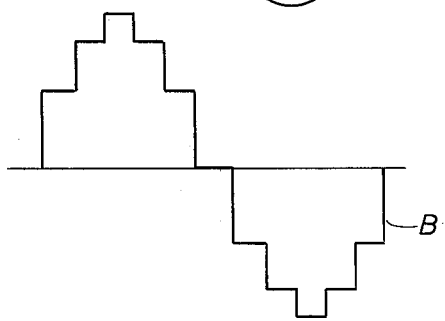

SIGNAL CANCELLING CIRCUIT

RELATED PATENTS

The present invention is related to U.S. Pat. No. 3,757,235, issued Sept. 4, 1973 and entitled "SIGNAL CANCELLATION".

BACKGROUND OF THE INVENTION

The present invention relates to a circuit for cancelling a noise signal that occurs in an electrical signal while preserving the desired signal having the same frequency as the noise signal. The present invention is useful only in cancelling a noise signal which has a constant phase and amplitude. This type of noise signal occurs in many electrical signals as a result of the power distribution system of a country. In power distribution systems the earth is used as one conductor in the system, and considerable stray currents having a steady phase and amplitude occur. The presence of stray currents having the frequency of the power system is particularly troublesome in electrical circuits that are processing signals having the same frequency as the power supply. This occurs in seismic explorations where the frequencies of interest include the 60 Hz band which corresponds to the frequency of the power system in the United States. This can be appreciated by the fact that in a seismic survey the geophones are placed on the ground and coupled to a recording truck by means of cables which also lay on the ground. Thus, there exists a ready means by which the 60 cycle power signal may be superimposed on the geophone signals.

Several circuits have been suggested for solving the problem of 60-cycle power supply signals being superimposed on the seismic signals of interest. As explained in the above patent, some systems rely upon the use of notch filters which are adjusted to filter out the 60-cycle signals. While this is a satisfactory solution to the problem of the 60 Hz noise, it also removes 60 Hz geophone signals which are of interest. Also, various circuits have been designed for manually balancing out the 60 Hz noise.

The above patent specifically discloses and claims a system in which the noise signal is detected and used as a reference for generating a signal having precisely the same amplitude as the noise signal and precisely 180° out of phase with the noise signal. While this system has been satisfactory and does cancel the noise signals, harmonics of the noise signal are not removed, and in effect, seriously effect the ability of the system to cancel the 60 Hz noise signal.

BRIEF DESCRIPTION OF THE INVENTION

The present invention solves the above problems by utilizing a sampling circuit to sample the instantaneous value of the noise signal and store the value in a storage circuit. A plurality of sampling and storage circuits are used to provide a plurality of values for the noise signal from which the noise signal can be reconstructed. Each of the individual sampling circuits is addressed in sequence by an addressing circuit that operates in synchronism with the frequency of the noise signal. After the instantaneous values of the noise signal have been sampled and stored, the sampling circuit is disabled. The addressing circuit continues to periodically couple the storage units to a feedback circuit. The feedback circuit supplies the value of the stored signal to the conductors carrying the desired signal to cancel the unwanted noise.

The sampling of the noise signal in the case of a seismic exploration system can be carried out prior to the actuation of the seismic source when only the 60 Hz power line signal will be present. Thus, the 60 Hz signal can be sampled and stored prior to the acutation of the seismic source and the recording of the seismic data. Normally, storage circuits can be designed that can store the instantaneous values of the noise signal substantially indefinitely in the case of digital circuits or for a considerable length of time in the case of analog circuits. When analog circuits are used, the storage must be periodically refreshed by coupling the sampling circuits to the geophone cables during a time interval when no seismic data is present on the cables. In addition, the feedback circuit must be a high-impedance circuit so that it does not load the storage means when analog devices are used as storage. Of course, if the storage means are digital, there will be no need for the high-impedance feedback circuit.

BRIEF DESCRIPTION OF THE DRAWINGS

The present invention will be more easily understood from the following detailed description of a preferred embodiment when taken in conjunction with the attached drawings, in which:

FIG. 1 is a schematic analog circuit for carrying out the present invention; and FIG. 2 shows two waveforms illustrating the actual noise signal and the feedback signal reconstructed from the stored instantaneous values of the noise signal.

PREFERRED EMBODIMENT

The circuit of the present invention is only useful in removing a noise signal that has a substantially constant phase and amplitude. When the noise signal results from power line interference with a desired signal, one can assume that the power line interference will remain constant in phase and amplitude. In addition, in the case of the analog version of the present circuit, the noise signal will be cancelled during the period that the storage means retains the true instantaneous value of the noise signal. It is relatively easy to construct storage circuits which have a useful memory of 2 minutes or more. These limitations on the circuit do not interfere with its use in seismic exploration where the storage means can be refreshed between each seismic disturbance and the related recording period.

Referring to FIG. 1, there is shown at 10 and 11 two conductors which form the signal pair of a seismic cable from which it is desired to remove the unwanted power line interference. The two signal conductors are coupled by means of resistances 13 and 14 to a balanced amplifier 12 that supplies a signal to the bus 15, which is the difference between the signals appearing on lines 10 and 11. The bus 15 is coupled to a plurality of sampling and storage means, only one of which is shown in detail. The number of sampling and storage means used will correspond to the desired number of samples of the interfering signal. When it is desired to cancel the higher harmonics of the interfering signal, a larger number of sampling and storage circuits are desirable. When it is only desired to cancel the fundamental frequency of the unwanted power signal, 10 to 12 sampling circuits will be sufficient.

The sampling circuit comprises a field-effect transistor 22 which is coupled by a lead 20 to the bus 15. The transistor is provided with a feedback circuit, including resistance 23, and operates as a switch means to periodically sample the signal appearing on the bus. The sampling period is controlled by a signal appearing on the address lead 26, providing the switch is not disabled by the enabling signal on the line 27. Thus, it is possible to apply a signal on the enabling line 27, which effectively blocks the switch 22 and prevents the circuit from sampling the signal appearing on the bus 15. The instantaneous amplitude of the sampled signal is stored on a storage means comprising the capacitor 25 and resistance 24.

The stored signal is retrieved when desired by the address circuit which supplies a signal on the lead 33 to actuate the transistor 31. The transistor 31 is also provided with a feedback resistance 32. In addition, a second or blocking transistor 30 is used in the reading circuit to provide isolation between the addressing circuit and the storage means. The signal from the transistor 31 is supplied to a second bus 34 which is, in turn, connected to all of the remaining sample and storage units schematically illustrated at 35.

The bus 34 is coupled to a first amplifier 40 that provides an amplification factor of −1, and has a relatively high impedance. This amplifier may be a conventional operational amplifier having a large amount of feedback. As explained above, the impedance of the amplifier 40 must be high to insure that the circuit for supplying the cancellation signal does not load the storage unit and thus, prematurely discharge the capacitor 25. The amplifier 40 is coupled by a resistance 41 to the lead 10, and to the input of a second amplifier 42. The second amplifier 42 is identical to the amplifier 40, and also supplies an amplification of −1. Thus, the signal at the output of the amplifier 42 will be exactly equal in amplitude to the signal of the amplifier 40, but 180° out-of-phase. The signal from the amplifier 42 is supplied through a resistance 43 to the lead 11.

The operation of the above circuit can be more easily understood from referring to FIG. 2, in which Curve A represents the unwanted 60 Hz power signal appearing on the leads 10 and 11. The points 1–12 illustrate the sampling points and the timing is determined by the address circuit. The address curcuit can be a conventional timing circuit which is synchronized with the 60 Hz power signal. This timing circuit may consist of a multiplying circuit for multiplying the 60 Hz signal by the desired number of samples in the present instance 12. This will provide a signal having a frequency 720 Hz, which can then be decoded to provide 12, addressing signals which will be in synchronism with the 60 Hz power. At each of the address points the instantaneous value of the 60 Hz power signal is sampled and stored on a storage unit. After the circuit has been operated a sufficient length of time to store the instantaneous values of the 60 Hz power signal, the enabled circuit can be actuated to effectively block the transistor 22. Thus, on the succeeding signals from the address circuit, no sample of the signal appearing on the bus 15 will be taken. While the signal will not be taken, the address circuit will operate the reading circuit to sample the value of the signal stored on the 12 storage means. This sampled value will then be supplied through the feedback circuit, comprising the amplifiers 40 and 42, to effectively cancel the 60 Hz signal on the leads 10 and 11. The reconstructed signal is illustrated in Curve B of FIG. 2, and will seem to be formed by a series of step voltages. While this signal does not exactly match the unwanted power signal, it approaches its shape, and effectively cancels it from the signal.

While the above system has been described in relation to analog circuitry, it is also possible to construct it with digital circuitry. In the case of digital circuitry, the instantaneous values of the unwanted 60 Hz power signals are converted to digital values which are then stored. Upon recall, the digital values can be reconverted to analog values which are supplied to the feedback circuit to effectively cancel the unwanted 60 Hz power signals. The advantage of using digital circuitry is that once sampled and stored, the values will not decrease or be bled off by the feedback circuit.

From the above description, it is seen that the storage units can be refreshed as often as desired, providing the signal of interest is not also present on the seismic cable. In a seismic system this can be done during integrals occurring between recording intervals.

I claim as my invention:

1. A passive system for canceling a noise signal while preserving a desired signal having the same frequency, said system comprising:
   a sample circuit, said sample circuit being disposed to sample said noise signal;
   an enabling circuit coupled to said sample circuit to enable said sample circuit at selected times to store the instantaneous values of said noise signal and block said sample circuit at all other times.
   an address means, said address means having N positions and being operable in synchronism with said noise signal;
   N storage units, said storage units being disposed to be coupled by said address means to said sample circuit, to sample and store a signal related to the instantaneous amplitude of the noise signal; and
   a feedback circuit having a high impedance, said feedback circuit being coupled by said address means to supply the stored signals to a circuit means to cancel said noise signal during time periods when said sample circuit is blocked by said enabling circuit.

2. The system of claim 1 wherein said noise signal comprises power line interference.

3. The system of claim 1 wherein said storage means are digital storage means and said feedback circuit includes means to convert the stored digital signals to analog signals.

4. The system of claim 1 wherein there are N sample circuits and N enabling circuits, said sample circuits being energized in sequence.

5. The system of claim 4 wherein there are N feedback circuits, said feedback circuits being addressed in sequence.

6. The system of claim 5 wherein each feedback circuit includes a field effect transistor disposed to couple the feedback circuit to the circuit means for canceling said noise signal.

7. The system of claim 4 wherein each of said sample circuit comprises a field effect transistor that is energized in sequence by said address means.

8. The system of claim 5 wherein each feedback circuit includes a pair of amplifiers, said storage units being coupled to one of said amplifiers, said one amplifier being coupled to the other of said amplifiers to provide both positive and negative values of said stored signal.

9. The system of claim 1 wherein said storage units are analog storage means.

10. The system of claim 3 wherein said enabling circuit is coupled to said field effect transistor to block said transistor during said other times.

11. A method for canceling an unwanted noise signal having a fixed frequency and phase, while preserving a desired signal having the same frequency, said method comprising:

sampling said noise signal at N preset intervals, said noise signal being free of said desired signal during said sampling;

separately storing the values obtained during said sampling;

discontinuing said sampling; and retrieving the stored signals and combining the retrieved signals with the desired signal to cancel the unwanted noise.

12. The method of claim 11 in which said sampling is controlled by the frequency of the noise signal.

* * * * *